United States Patent [19]

Tihanyi

[11] Patent Number: 5,798,666
[45] Date of Patent: Aug. 25, 1998

[54] CIRCUIT CONFIGURATION FOR TRIGGERING A POWER ENHANCEMENT MOSFET

[75] Inventor: Jenoe Tihanyi, Kirchheim, Germany

[73] Assignee: Siemens Aktiengesellschaft, Munich, Germany

[21] Appl. No.: 721,547

[22] Filed: Sep. 26, 1996

[30] Foreign Application Priority Data

Sep. 27, 1995 [DE] Germany .................... 195 35 987.9

[51] Int. Cl.$^6$ ................................................ H03K 17/04
[52] U.S. Cl. .......................... 327/377; 327/108; 327/434
[58] Field of Search ................... 327/108–112, 374–377, 327/427, 434, 437

[56] References Cited

U.S. PATENT DOCUMENTS 5,475,329  12/1995  Jones et al. ........................... 327/377
5,592,117   1/1997  Nadd ................................... 327/377

FOREIGN PATENT DOCUMENTS 0 236 967 B1   9/1987  European Pat. Off. .
0 572 706 A1  12/1993  European Pat. Off. .

Primary Examiner—Timothy P. Callahan
Assistant Examiner—Kenneth B. Wells
Attorney, Agent, or Firm—Herbert L. Lerner; Laurence A. Greenberg

[57] ABSTRACT

Power MOSFETs with a source-side load are often triggered by so-called charge pumps. In order to provide a faster turnoff, until now the gate-to-source capacitance of the power MOSFET, which is typically constructed as an enhancement MOSFET, has been discharged through a depletion MOSFET that is parallel to the gate-to-source path. Those different MOSFET types require complicated and expensive production technology. A circuit configuration is proposed that makes it possible to use solely enhancement MOSFETs.

10 Claims, 2 Drawing Sheets

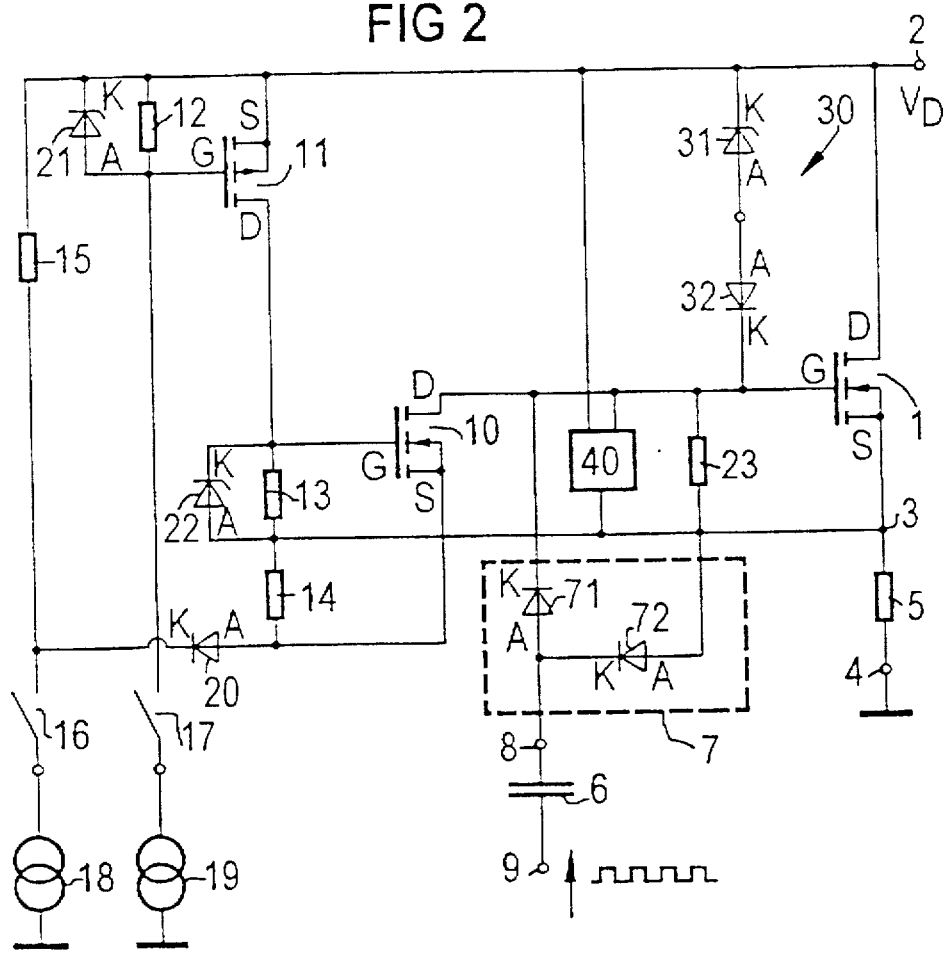

CIRCUIT CONFIGURATION FOR TRIGGERING A POWER ENHANCEMENT MOSFET

BACKGROUND OF THE INVENTION

1. Field of the Invention

The invention relates to a circuit configuration for triggering a power enhancement MOSFET with a source-side load, wherein a drain terminal connection of the power MOSFET is connected to a terminal for the application of a supply voltage, a gate terminal connection of the power MOSFET is connected through a rectifier configuration and a capacitor to a control input terminal for the application of an alternating voltage signal, a gate-to-source capacitance of the power MOSFET can be discharged through a second MOSFET, a source terminal connection and a drain terminal connection of the power MOSFET are connected to one another through a series circuit of a resistor and a load path of a third MOSFET, the third MOSFET is an enhancement MOSFET of the opposite channel type, a current source is connected through a controllable switch and a resistor to the terminal for supply voltage, and a junction between the controllable switch and the resistor is connected to the gate terminal connection of the third MOSFET.

Such a circuit configuration is described, for instance, in Published European Patent Application 0 236 967 B1. That circuit configuration operates by the principle of the known voltage doubler circuit. With such a circuit, it is possible to cause a MOSFET, in particular a power MOSFET, with a source-side load, to be fully conducting even when the potential at the gate terminal connection is lower than the potential at the drain terminal connection. In the circuit configuration described therein, triggering of the MOSFET requires a total of three control signals. In order to turn on the MOSFET, an alternating voltage signal must be applied to the second terminal connection of the capacitor for the duration of the intended ON period, and for the same period of time, a switching signal of opposite polarity must be applied to the other two input terminals. The positive control signal to be applied to one of the three terminals after the ON period has elapsed serves to turn on a transistor, which is located with its load path between the gate terminal connection of the MOSFET and reference potential, so as to assure a fast discharge of the gate-to-source capacitance of the MOSFET, so that the MOSFET can turn off quickly.

The necessity of three control signals to turn on the MOSFET is inconvenient. Another problem is that the trigger circuit for turning on the MOSFET must be connected to the ground potential of the load.

Another trigger circuit for a MOSFET is known from Published European Patent Application 0 572 706 A1. The circuit configuration described therein likewise has a series circuit, connected to the gate terminal connection of the power MOSFET, of a capacitor with a rectifier configuration. In order to speed up the turnoff process, a depletion MOSFET is connected parallel to the gate-to-source path of the power MOSFET. The depletion MOSFET is turned on when a suitable control signal is applied to its gate terminal connection. In that circuit configuration, the voltages of the charge pump are referred to the operating voltage. Thus the circuit is functional even if the ground potential of the trigger logic differs from the load-to-ground potential. A problem in that circuit configuration is that in addition to the alternating voltage signal to be applied to the capacitor at the input to the charge pump, a further, separate control signal for triggering the depletion MOSFET must be provided.

In those known circuit configurations, in each case the power MOSFET is an enhancement MOSFET, having a gate-to-source capacitance which is discharged, for the sake of speedier turnoff, through a depletion MOSFET connected parallel to the gate-to-source path. The various MOSFET types require a complicated and expensive production technique, since the depletion MOSFET requires both one additional mask and one additional oxidation and implantation step when the circuit configuration is constructed inside a semiconductor body.

SUMMARY OF THE INVENTION

It is accordingly an object of the invention to provide a circuit configuration for triggering a power enhancement MOSFET, which overcomes the hereinafore-mentioned disadvantages of the heretofore-known devices of this general type, which permits the use of enhancement FETs only and which is thus simpler to manufacture.

With the foregoing and other objects in view there is provided, in accordance with the invention, a circuit configuration for triggering a power enhancement MOSFET, comprising a terminal for application of a supply voltage, the terminal being connected to a drain terminal connection of a first power MOSFET of one channel type having a source-side load; a first control input terminal for application of an alternating voltage signal, a capacitor connected to the first control input terminal, a rectifier configuration connected between the capacitor and a gate terminal connection of the first power MOSFET; a second enhancement MOSFET of the same channel type as the first power MOSFET for discharging a gate-to-source capacitance of the first power MOSFET, the second enhancement MOSFET having a gate terminal connection and a source terminal connection; a third enhancement MOSFET of the opposite channel type as the first power MOSFET having a load path and a gate terminal connection, a first resistor connected to the load path of the third MOSFET at a first junction connected to the gate terminal connection of the second MOSFET, the first resistor and the load path of the third MOSFET being connected in a series circuit between a source terminal connection and the drain terminal connection of the first power MOSFET; a first controllable switch, a second resistor connected to the first controllable switch at a second junction, the second junction being connected to the gate terminal connection of the third MOSFET, a first current source connected through the first controllable switch and the second resistor to the terminal for the supply voltage; a second controllable switch, a third resistor connected to the second controllable switch at a third junction, a second current source connected through the second controllable switch and the third resistor to the terminal for the supply voltage; and a diode having a cathode terminal connection connected to the third junction and an anode terminal connection connected to the source terminal connection of the second MOSFET; the first power MOSFET being turned on by opening the two controllable switches and the first power MOSFET being turned off by closing the two controllable switches.

In accordance with another feature of the invention, there is provided a Zener diode connected parallel to the first resistor.

In accordance with a further feature of the invention, there is provided a Zener diode connected parallel to the second resistor.

In accordance with an added feature of the invention, the two controllable switches can be turned on and off simultaneously.

In accordance with an additional feature of the invention, the current sources are constructed as resistors.

In accordance with yet another feature of the invention, there is provided a diode device connected between the drain terminal connection and the gate terminal connection of the first power MOSFET.

In accordance with yet a further feature of the invention, the diode device has a series circuit of a Zener diode and another diode, the Zener diode having a cathode terminal connection connected to the terminal for the supply voltage, and the other diode having a cathode terminal connection connected to the gate terminal connection of the first power MOSFET.

In accordance with yet an added feature of the invention, the controllable switches are p-channel or n-channel MOSFETs.

In accordance with a concomitant feature of the invention, there is provided a current limiter configuration for turning off the first power MOSFET in the event of an overload current.

Other features which are considered as characteristic for the invention are set forth in the appended claims.

Although the invention is illustrated and described herein as embodied in a circuit configuration for triggering a power enhancement MOSFET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic diagram of a second exemplary embodiment of a circuit configuration according to the invention, with overload current and overload voltage protection.

DESCRIPTION OF THE PREFERRED EMBODIMENTS

Figure 1:
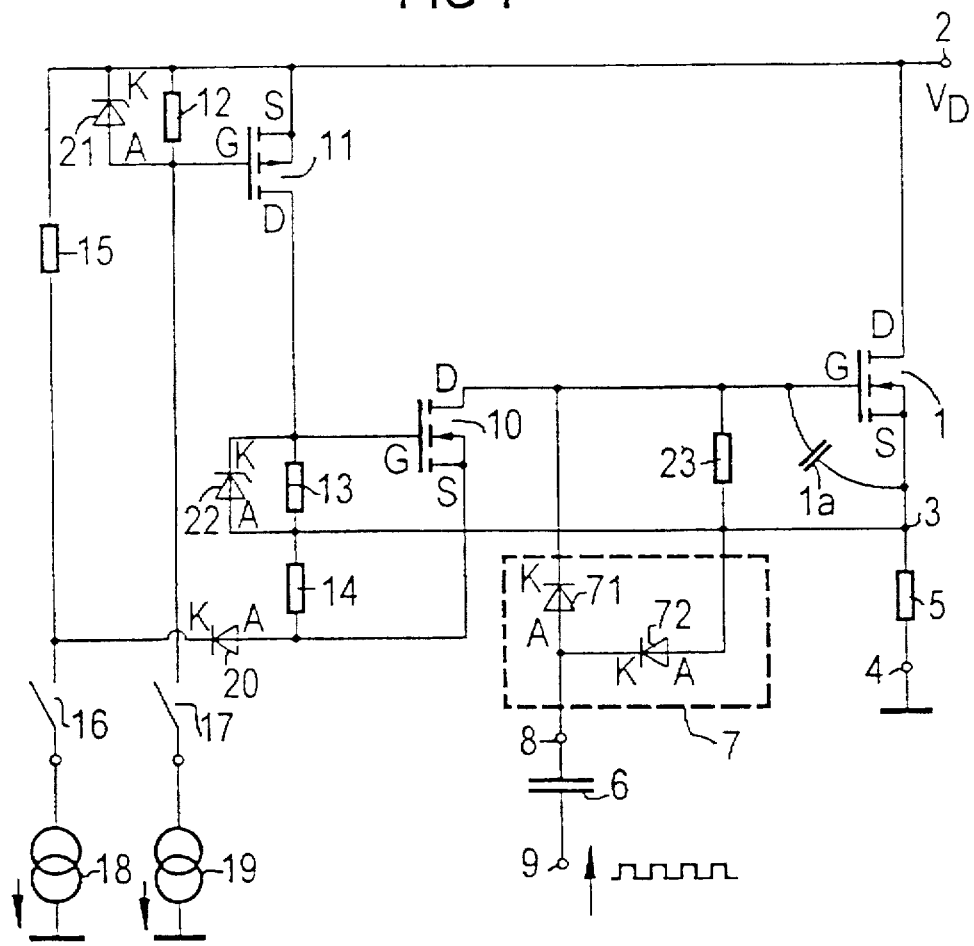
FIG. 1 is a schematic diagram of a first exemplary embodiment of a circuit configuration according to the invention.

Referring now in detail to the figures of the drawings in which, unless otherwise indicated, the same reference numerals represent the same elements with the same meaning, and first, particularly, to FIG. 1 thereof, there is seen a circuit configuration which includes a first power MOSFET 1, in this case an enhancement MOSFET of the n-channel type, having a drain terminal connection D that is connected to a terminal 2 and a source terminal connection S that is connected to a terminal 3. The terminal 2 is intended for the application of a supply voltage $V_D$. A load 5, which can be switched by the power MOSFET 1 to the terminal 2 and therefore to the supply voltage $V_D$, is connected between the terminal 3 and a terminal 4, which is connected to reference or ground potential. The load 5 may, for example, be a lamp, a motor, a valve, or the like. A gate terminal connection G of the power MOSFET 1 is connected through a first rectifier configuration 7 to a first terminal connection 8 of a capacitor 6. This capacitor 6 is a component of a charge pump circuit, for raising a gate potential at the gate terminal connection G of the power MOSFET 1 to turn on the power MOSFET, in accordance with control signals of a non-illustrated trigger circuit, to such high values that the power MOSFET 1 turns on reliably, and reliably remains turned on as long as a suitable control signal is applied to the trigger circuit. In order to turn on the power MOSFET 1, the trigger circuit furnishes an alternating voltage signal, in particular a rectangular or square signal, at a second terminal connection 9 of the capacitor 6.

This alternating voltage signal may, for instance, be a clocked direct voltage, having a rise which is equivalent to the supply voltage $V_D$.

In order to assure that an adequate positive gate potential is in fact present at the gate terminal connection G of the power MOSFET 1 when an alternating voltage signal is applied to the second terminal connection 9 of the capacitor 6, the rectifier configuration 7 is polarized in a suitable way. In the exemplary embodiment of FIG. 1, the rectifier configuration 7 has a first diode 71 with a cathode terminal connection K connected to the gate terminal connection G of the power MOSFET 1 and an anode terminal connection A connected to the first terminal connection 8 of the capacitor 6. The rectifier configuration 7 also has a second diode 72 with a cathode terminal connection K connected to the terminal connection 8 of the capacitor 6. An anode terminal connection A of this second diode 72 is connected to the terminal 3 and thus to the source terminal connection S of the power MOSFET 1 and is also connected through a resistor 23 to the gate terminal connection G of the power MOSFET 1. The conducting direction of this first rectifier configuration 7 is consequently chosen in such a way that a positive potential is always present at the gate terminal connection of the power MOSFET 1 as long as an alternating voltage signal is applied to the second terminal connection 9 of the capacitor 6 and as long as a second enhancement MOSFET 10, which is to be described below and is intended for discharging the gate-to-source capacitance, is turned off.

If the load 5 is to be disconnected from the supply voltage $V_D$, then the power MOSFET 1 should be turned off. In order for this to happen as fast as possible, a gate-to-source capacitance 1a of the power MOSFET 1, which is shown in FIG. 1, must be discharged as fast as possible. This purpose is served by the second MOSFET 10 having a load path that is connected parallel to the gate-to-source capacitance, along with additional circuit components that will be described below with reference to FIG. 1.

The second MOSFET 10 has a drain terminal connection D connected to the gate terminal connection G of the power MOSFET 1. A source terminal connection S of this second MOSFET 10 is connected to one terminal connection of a resistor 14 that has another terminal connection which is connected to the terminal 3. A series circuit of a load path of a third enhancement MOSFET 11 and a first resistor 13 is connected between the terminal 2 and the terminal 3. A source terminal connection S of the third MOSFET 11 is connected to the terminal 2 and one terminal connection of the resistor 13 is connected to the terminal 3. A gate terminal connection G of the MOSFET 10 is connected to a drain terminal connection D of the MOSFET 11.

Two current sources 18, 19 each have one terminal connection connected to the terminal 4 for the reference potential. Another available or free terminal connection of each of these second and first current sources 18, 19 is connected through a respective second and first controllable switch 16, 17 to a respective resistor 15, 12. A second junction is connected between the controllable switch 17 and the resistor 12. Free or available terminal connections of these third and second resistors 15, 12 are in contact with the terminal 2 to which the supply voltage $V_D$ is to be applied. A junction of the resistor 14 and the source terminal connection S of the second MOSFET 10 is connected to an anode terminal connection A of a diode 20. A cathode terminal connection K of this diode 20 is in contact with a third junction of the resistor 15 and the controllable switch 16.

Zener diodes 21, 22 may be connected parallel to the resistors 12 and 13. The Zener diode 21, which has a cathode terminal connection K connected to the terminal 2, protects the gate-to-source capacitance of the third MOSFET 11 from overvoltage. The Zener diode 22, which has a cathode terminal connection K that is connected to a first junction of the resistor 13 and the drain terminal connection D of the third MOSFET 11 and therefore is also connected to the gate terminal connection G of the second MOSFET 10, prevents saturation of the second MOSFET 10.

The MOSFETs 1, 10 and 11 shown in FIG. 1 are all of the enhancement type. In addition, the power MOSFET 1 and the second MOSFET 10 are of the n-channel type, while the third MOSFET 11 is of the p-channel type.

The mode of operation of the circuit configuration shown in FIG. 1 can be described as follows:

First, it is assumed that the controllable switches 16, 17, which may be constructed as p-channel or n-channel MOSFETs, are open. It should be noted in this case that the two controllable switches 16, 17 are suitably simultaneously open or closed. By agreement, an alternating voltage signal is present at the terminal connection 9 of the capacitor 6. This alternating voltage signal leads to a positive potential at the gate terminal connection G of the power MOSFET 1 that is high enough to ensure that the power MOSFET 1 turns on and remains turned on, as long as the alternating voltage signal is present at the terminal connection 9 of the capacitor 6 and the controllable switches 16, 17 are open. It is assumed that the supply voltage VD at the terminal 2 is +15 V. As an example, +20 V is present at the gate terminal connection G of the power MOSFET 1. The second MOSFET 10 and the third MOSFET 11 are each turned off, so that the gate-to-source capacitance 1a of the power MOSFET 1 remains charged.

In order to open and therefore turn off the power MOSFET 1, the two controllable switches 16 and 17 are closed, preferably simultaneously. The potential at the source terminal connection S of the second MOSFET 10 is reduced so far by the closure of the controllable switch 17, as compared with its gate potential, that the second MOSFET 10 turns on. As soon as this second MOSFET 10 turns on, the gate-to-source capacitance 1a of the power MOSFET 1 is discharged, and the power MOSFET 1 turns off. As a result of the turning on of the controllable switch, the gate potential at the third MOSFET 11 simultaneously becomes high enough to turn on this third MOSFET 11. As a result, except for the voltage drop along the load path of the third MOSFET 11, virtually the entire potential of the supply voltage $V_D$ reaches the gate terminal connection G of the second MOSFET 10. The gate potential at this second MOSFET 10 is raised nearly to the supply voltage $V_D$, and as a result, the second MOSFET 10 remains reliably on.

In order to turn the power MOSFET 1 on and off, the alternating voltage signal present at the terminal connection 9 of the capacitor 6 need not absolutely be turned off, since in the ON state of the second MOSFET 10, this alternating voltage signal can no longer cause charging of the gate-to-source capacitance 1a of the power MOSFET 1.

FIG. 2 shows an improved circuit configuration, as compared with the circuit configuration of FIG. 1. In order to protect against overvoltage and especially overvoltage spikes, a diode device 30 is connected between the drain terminal connection D and the gate terminal connection G of the power MOSFET 1. This diode device 30 has a Zener diode 31, with a series-connected diode 32. A cathode terminal connection K of the Zener diode 31 is connected to the terminal 2, and a cathode terminal connection K of the diode 32 is connected to the gate terminal connection G of the power MOSFET 1. Anode terminal connections A of the two diodes 31, 32 are connected to one another. In addition, the circuit configuration has a current limiter configuration 40, that is known per se. This current limiter configuration 40 has three terminal connections, which are connected to the gate terminal connection G, the drain terminal connection D, and the source terminal connection S of the power MOSFET 1. The current limiter configuration may, for instance, be an IGBT, with a series-connected resistor, which is connected parallel to the load path of the power MOSFET 1 and in which a junction controls a switching transistor that has a load path connected between the gate terminal connection G and the source terminal connection S of the power MOSFET 1. The circuit configurations shown in FIGS. 1 and 2 can easily be integrated into a semiconductor body. By way of example, the diodes 20, 21, 22, 31, 32, 71 and 72 shown may be MOS diodes. The current sources 18, 19 may be resistors constructed as MOSFETs.

I claim:

1. A circuit configuration for triggering a power enhancement MOSFET, comprising:

a) a terminal for application of a supply voltage, said terminal being connected to a drain terminal connection of said power enhancement MOSFET of one channel type having a source-side load;

b) a first control input terminal for application of an alternating voltage signal, a capacitor connected to said first control input terminal, a rectifier configuration connected between said capacitor and a gate terminal connection of the first power MOSFET;

c) a second enhancement MOSFET of the same channel type as the first power MOSFET for discharging a gate-to-source capacitance of the first power MOSFET, said second enhancement MOSFET having a gate terminal connection and a source terminal connection;

d) a third enhancement MOSFET of the opposite channel type as the first power MOSFET having a load path and a gate terminal connection, a first resistor connected to the load path of said third MOSFET at a first junction connected to the gate terminal connection of said second MOSFET, said first resistor and the load path of said third MOSFET being connected in a series circuit between a source terminal connection and the drain terminal connection of the first power MOSFET;

e) a first controllable switch, a second resistor connected to said first controllable switch at a second junction, said second junction being connected to the gate terminal connection of said third MOSFET, a first current source connected through said first controllable switch and said second resistor to said terminal for the supply voltage;

f) a second controllable switch, a third resistor connected to said second controllable switch at a third junction, a second current source connected through said second controllable switch and said third resistor to said terminal for the supply voltage; and g) a diode having a cathode terminal connection connected to said third junction and an anode terminal connection connected to the source terminal connection of said second MOSFET;

h) the first power MOSFET being turned on by opening said two controllable switches and the first power MOSFET being turned off by closing said two controllable switches.

2. The circuit configuration according to claim 1, including a Zener diode connected parallel to said first resistor.

3. The circuit configuration according to claim 1, including a Zener diode connected parallel to said second resistor.

4. The circuit configuration according to claim 1, wherein said two controllable switches can be turned on and off simultaneously.

5. The circuit configuration according to claim 1, wherein said current sources are constructed as resistors.

6. The circuit configuration according to claim 1, including a diode device connected between the drain terminal connection and the gate terminal connection of the first power MOSFET.

7. The circuit configuration according to claim 6, wherein said diode device has a series circuit of a Zener diode and another diode, said Zener diode having a cathode terminal connection connected to said terminal for the supply voltage, and said other diode having a cathode terminal connection connected to the gate terminal connection of the first power MOSFET.

8. The circuit configuration according to claim 1, wherein said controllable switches are p-channel MOSFETs.

9. The circuit configuration according to claim 1, wherein said controllable switches are n-channel MOSFETS.

10. The circuit configuration according to claim 1, including a current limiter configuration for turning off the first power MOSFET in the event of an overload current.

* * * * *